(12) United States Patent
Wang et al.

(10) Patent No.: US 7,573,277 B2
(45) Date of Patent: Aug. 11, 2009

(54) THIN FILM PROBE CARD

(75) Inventors: Chih-Yuan Wang, Taichung County (TW); Heng-Yi Chang, Taipei (TW)

(73) Assignee: Wintek Corporation, Taichung (TW)

( * ) Notice: Subject to any disclaimer, the term of this patent is extended or adjusted under 35 U.S.C. 154(b) by 267 days.

(21) Appl. No.: 11/595,943

(22) Filed: Nov. 13, 2006

(65) Prior Publication Data
US 2007/0108999 A1 May 17, 2007

(30) Foreign Application Priority Data
Nov. 15, 2005 (TW) .............................. 94140170 A (51) Int. Cl.
*G01R 31/02* (2006.01)
(52) U.S. Cl. ..................................... 324/754
(58) Field of Classification Search ........................ None
See application file for complete search history.

(56) References Cited

U.S. PATENT DOCUMENTS

| | | | |
|---|---|---|---|
| 6,791,347 B2* | 9/2004 | Ishizaka et al. ............. 324/761 |
| 6,900,647 B2* | 5/2005 | Yoshida et al. ............. 324/754 |
| 6,917,211 B2* | 7/2005 | Yoshida et al. ............. 324/754 |
| 2004/0021474 A1* | 2/2004 | Crippen ...................... 324/754 |
| 2005/0007130 A1* | 1/2005 | Yoshida et al. ............. 324/754 |
| 2005/0184745 A1* | 8/2005 | Machida et al. ............ 324/754 |
| 2007/0103178 A1* | 5/2007 | Kasukabe et al. .......... 324/754 |
| 2007/0296435 A1* | 12/2007 | Eldridge et al. ............ 324/761 |
| 2008/0238458 A1* | 10/2008 | Eldridge ..................... 324/754 |
| 2009/0121732 A1* | 5/2009 | Crafts et al. ................ 324/757 |

* cited by examiner

*Primary Examiner*—Jermele M Hollington
(74) *Attorney, Agent, or Firm*—Bacon & Thomas, PLLC (57) ABSTRACT

A thin film probe card includes a plate and a plurality of wires on the plate, each of which is electrically connected with at least a thin film probe. A plurality of elastic members are provided between the probes, which absorbs the force of the probes in the test to protect the probes from wear and extend the product life of the probe card.

20 Claims, 11 Drawing Sheets

THIN FILM PROBE CARD

BACKGROUND OF THE INVENTION

1. Field of the Invention

The present invention relates generally to a testing device of electric circuit, and more particularly to a thin film probe card with flexible buffer device.

2. Description of the Related Art

Figure 1:
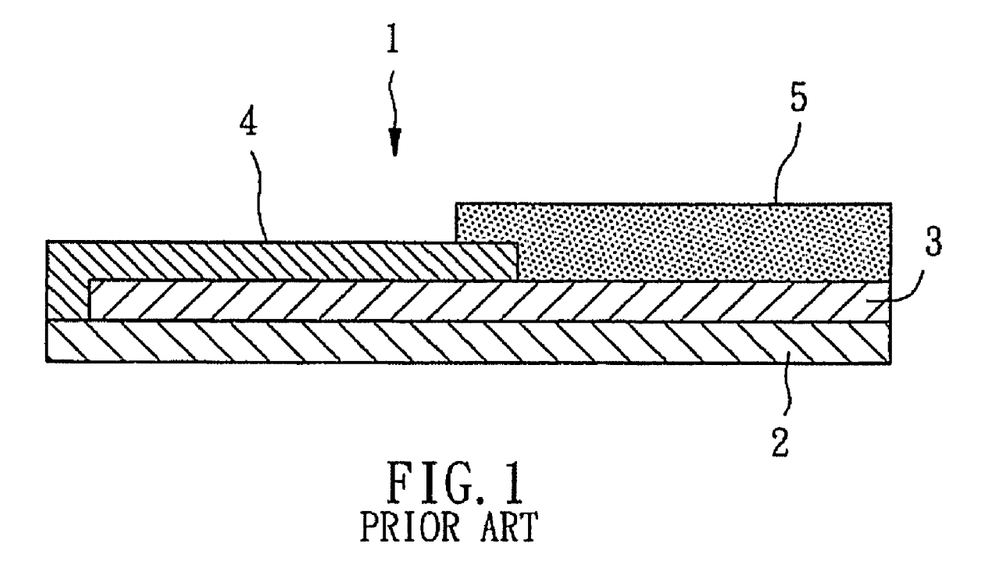
FIG. 1 is a sectional view of the conventional probe card.
Figure 2:
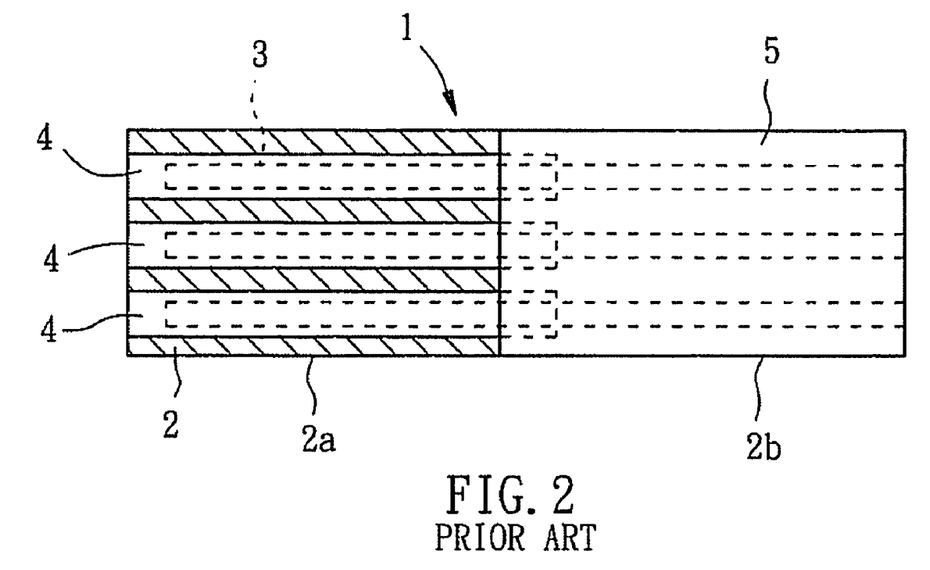
FIG. 2 is a top view of the conventional probe card.

FIG. 1 and FIG. 2 show a conventional thin film probe card 1 for testing of optical display panels, such as liquid crystal display. The probe card 1 includes a plate 2, a plurality of wires 3, a plurality of probes 4 and an insulating film 5. The plate 2 has a contacting portion 2a and a non-contacting portion 2b. Each of the wires 3 is associated with conductive wires 6a of a testing panel 6 (FIG. 3) respectively. The probes 4 are made of conductive metal foils to cover the wires 3 on the contacting portion 2a. The insulating film 5 covers the cover the wires 3 on the non-contacting portion 2.

Figure 3:
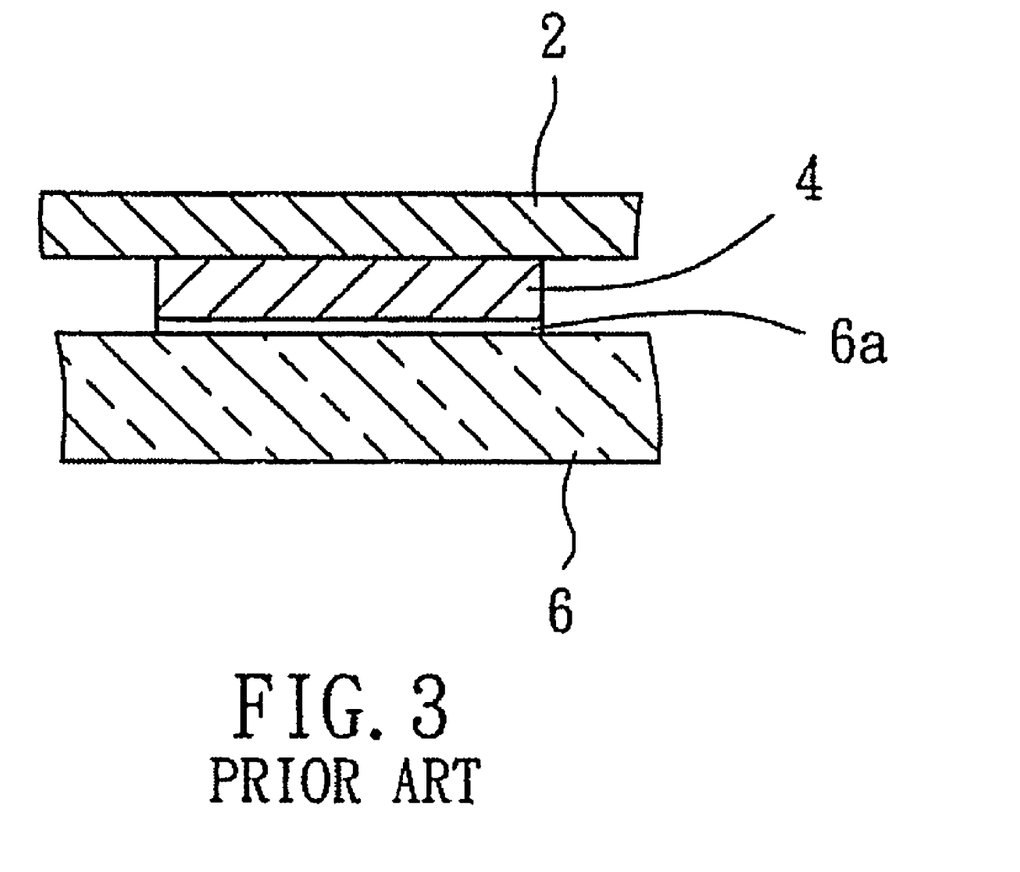
FIG. 3 is sketch diagram of the conventional probe card in connection with the testing panel.

As shown in FIG. 3, the probes 4 of the probe card 1 contact the conductive wires 6a, such as ITO conductive film, of the testing panel 6 respectively to activate the panel. The feedback of the optical signals from the testing panel 6 will tell which the wires 6a of the panel are failure. However, in the real testing process, the probes 4 of the probes card 1 may be worn or broken after a long time of user because that the probes are contacting the wires 6a of the testing panel 6 directly, and the probes 4 take the entire pressure. The worn or broken probes 4 have a poor conductive contact with the wires 6a that is bad for the testing and shorts the life of the probe card 1.

In addition, in the condition of the probes 4 of the probe card 1 contacting the wires 6a of the testing panel 6, the wires 6a may be damaged as well that pieces of the wires 6a may be left on the probes 4. It affects the accuracy of the testing and may damage the testing panels also.

SUMMARY OF THE INVENTION

The primary objective of the present invention is to provide a thin film probe card, which may reduce the pressure exerted on the probes when the probes contact the testing panel to protect the probe and extend the life of the probe card.

According to the objective of the present invention, a probe card includes a plate with a plurality of wires thereon. Each of the wires is electrically connected with at least a probe. Each of the probes has a conductive contacting portion to electrically connect a testing electric device. The probe card further includes a plurality of first elastic members with a first top touching the testing electric device and second elastic members on the wires, each of which has a second top touching the testing electric device.

DETAILED DESCRIPTION OF THE INVENTION

Figure 4:
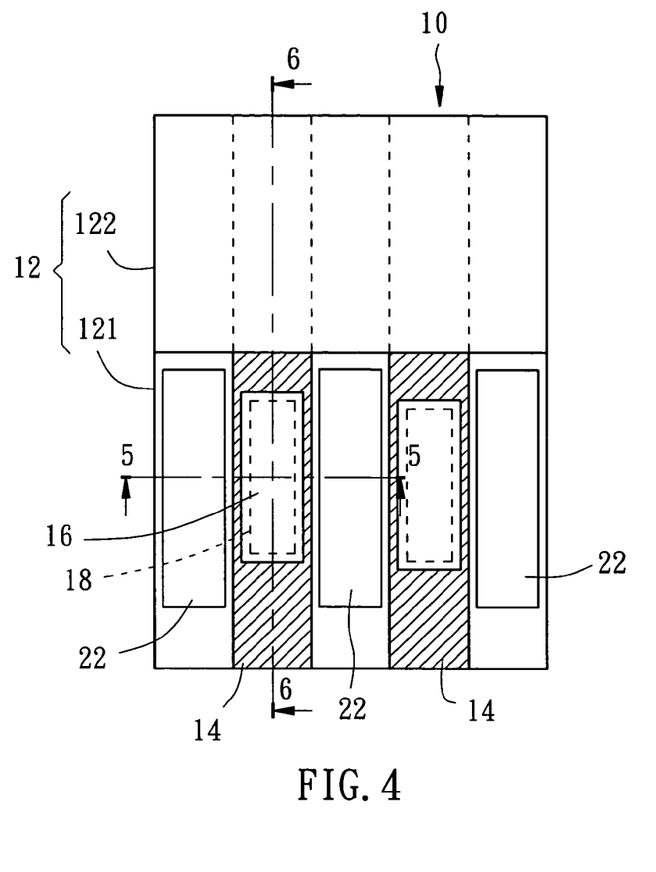
FIG. 4 is a top view of a first preferred embodiment of the present invention.
Figure 5:
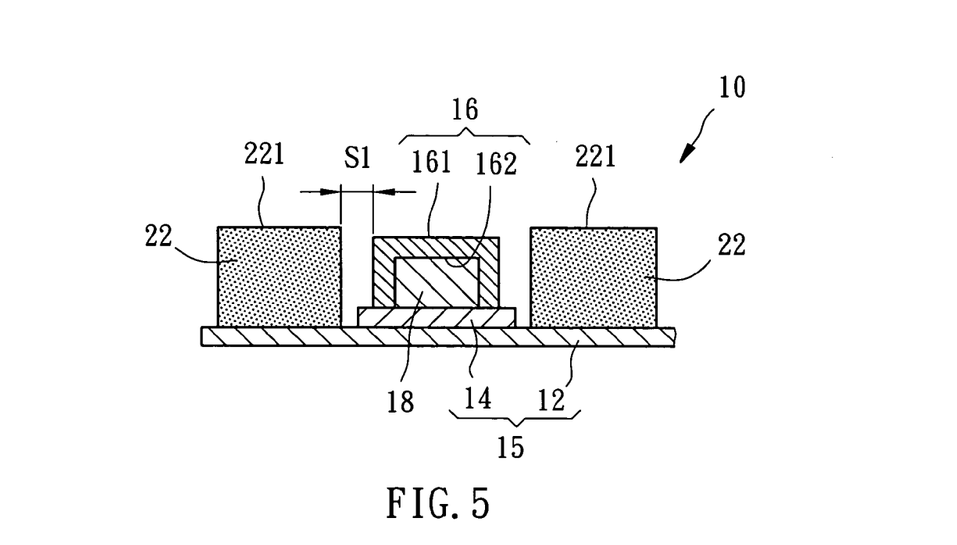
FIG. 5 is a sectional view along 5-5 line of FIG. 4.
Figure 6:
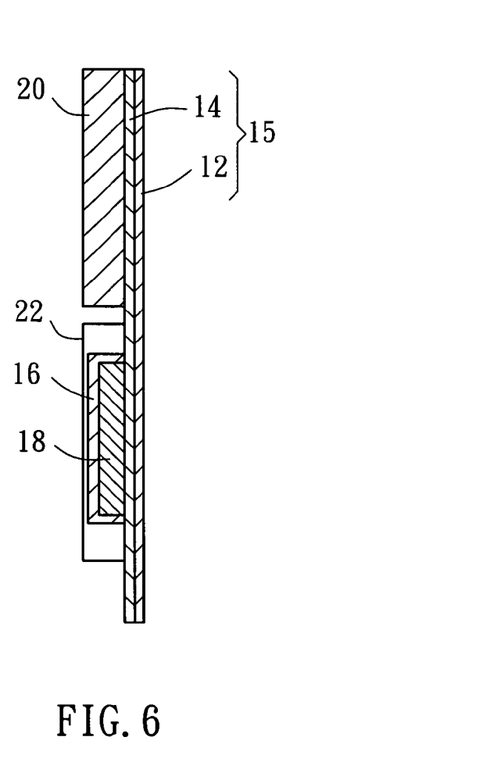
FIG. 6 is a sectional view along 6-6 line of FIG. 4.
Figure 7:
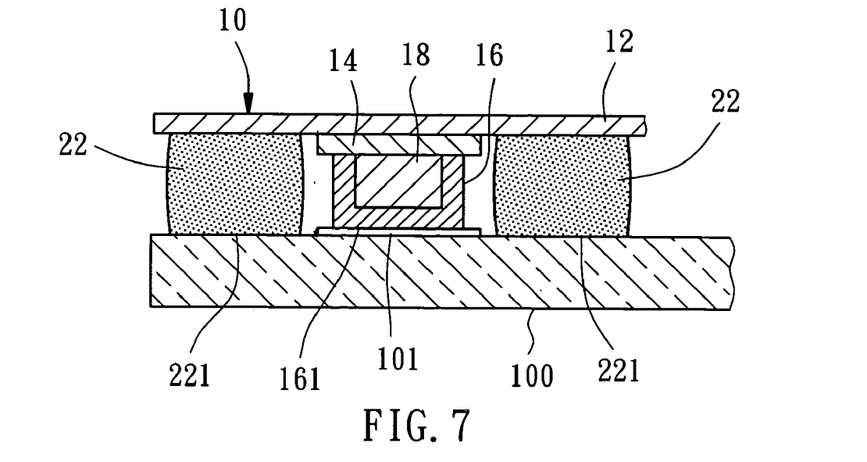
FIG. 7 is sketch diagram of the probe card of the first preferred embodiment of the present invention in connection with the testing panel.

FIG. 4 to FIG. 6 show a probe card 10 of the first preferred embodiment of the present invention, which is used in test of a circuit of a testing device. FIG. 7 shows the probe card 1 of the present invention is conductively connected to a liquid crystal panel 100 for testing.

The probe card 10 of the first preferred embodiment of the present invention includes a substrate 15 with a plate 12 and a plurality of wires 14 on the plate 12, a plurality of probes 16, a plurality of conductive members 18, an insulating film 20 and a plurality of first elastic members.

The plate 12 has a contacting portion 121 and a non-contacting portion 122.

The wires 14 are extended on both of the contacting portion 121 and the non-contacting portion 122 in parallel, which transfer electric signals in the test.

The probes 16 are conductive foils made of nickel or nickel alloy. Each of the wires 14 on the contacting portion 121 of the plate 12 includes one or more probes 16 respectively. The number of the probes 16 is according to the circuit of the testing device. FIG. 4 shows each of the wires 14 having one probe 16 respectively. Each of the probes 16 includes a conductive contacting portion 161 and a first space 162 therein.

The conductive members 18 are made of a material with well conductive property. In the present invention, the conductive members 18 are made of copper. The conductive members 18 are received in the first spaces 162 of the probes 16 respectively. The conductive members 18 are totally covered by the probes 16 to prevent them from oxidization by contacting air or water. The conductive members 18 may enhance the conductive property between the wires 14 and the probes 16.

The insulating film 20 covers the wires 14 on the non-contacting portion 122 to protect the wires 14 from damage.

The first elastic members 22 are provided on the contacting portion 121 of the plate 12, and between two of the first elastic members 22 is one of the probes 16. Each of the first elastic members 22 includes a first top 221. FIG. 5 shows the probes 10 in a normal condition, in which there is a first interval S1 between the elastic member 22 and the corresponding probe 16 respectively, and the first top 221 of the first elastic member 22 is a little higher than the conductive contacting portion 161 of the probe 16. The elastic members 22 are made of a material, which may be pressed for deformation, chosen from epoxy resin, PAC resin, acrylic resin, t-BOC resin, PHS resin, COMA resin, cyclic olefin resin, and rubber and the relative materials.

The elements of the probe card 10 of the present invention are described, and the operation of the probe card 10 will be described hereunder:

As shown in FIG. 7, the first tops of the first elastic members 22 touch the liquid crystal panel 100 first. When the probe card 10 moves toward the liquid crystal panel 100, the first elastic members 22 are pressed for deformation. When the conductive contacting portions 161 of the probes 16 are electrically contacted with a ITO conductive film 101 of the liquid crystal panel 100, the probe card 10 of the present invention may test the electrical property of the ITO conductive film 101.

In the test, the first elastic members 22 absorb the contacting force and transfer it into heat, such that the first elastic members 22 may buffer the probes 16 to protect the probes 16 from break or wear so as to extend the product life of the probe card 10 of the present invention. For the same situation, it prevents the ITO conductive film 101 from damage also and reduces pieces of the probes 16 and glass, or dust (the diameter greater than S1) left on the ITO conductive film 101 that keeps a well accuracy of test. In addition, the first elastic members 22 are located at outer sides of the probes 16 that may bar particles to damage the probes 16.

Figure 8:
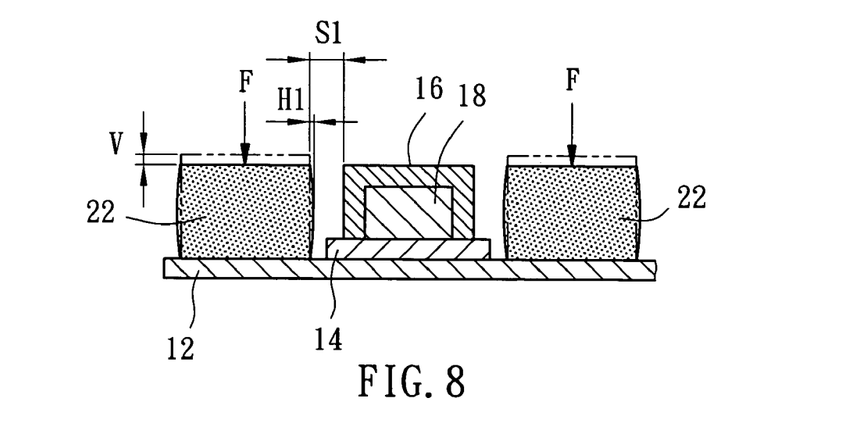
FIG. 8 is a sketch diagram of the preferred embodiment of the present invention, showing the first elastic member bending.

FIG. 8 shows the first elastic member 22 of the probe card 10 of the first preferred embodiment deformed. To prevent the deformed first elastic members 22 press the neighboring probes 16, the vertical deformation V and horizontal deformation of the first elastic member 22 is calculated and tested when a certain force F exerted thereon. Basically, when the first elastic member 22 is pressed, the first elastic member 22 is expended along all directions but the vertical direction. For explanation of the deformation of the first elastic member 22 relative to the neighboring probe 16, the horizontal deformation of the first elastic member 22 is defined as a first deformation H1, which indicates the expansion of the first elastic member 22 toward the neighboring probe 16. The vertical deformation V is preferred smaller than the first deformation H1. However, when the first elastic member 22 is made of a very soft material or a material with a loose structure, the vertical deformation V may be greater than the first deformation H1.

The main character of the present invention is that the first deformation H1 has to be smaller than or identical to the first interval S1 that prevent the neighboring probe 16 from damage by the expansion of the first elastic member 22.

Figure 9:
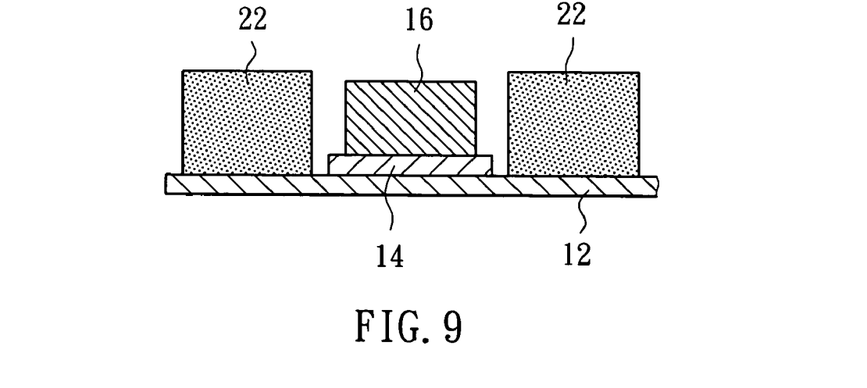
FIG. 9 is a sketch diagram of the first preferred embodiment of the present invention, showing the probes in direct connection with the wires.

In the first preferred embodiment, the probes 16 of the probes card 10 have conductive members 18 therein to enhance the electrical conduction between the wires 14 and the probes 16. Of course, the probes 16 may have no conductive member 18, as shown in FIG. 9, to contact the probes 16 with the wires 14 directly.

Figures 10, 11:
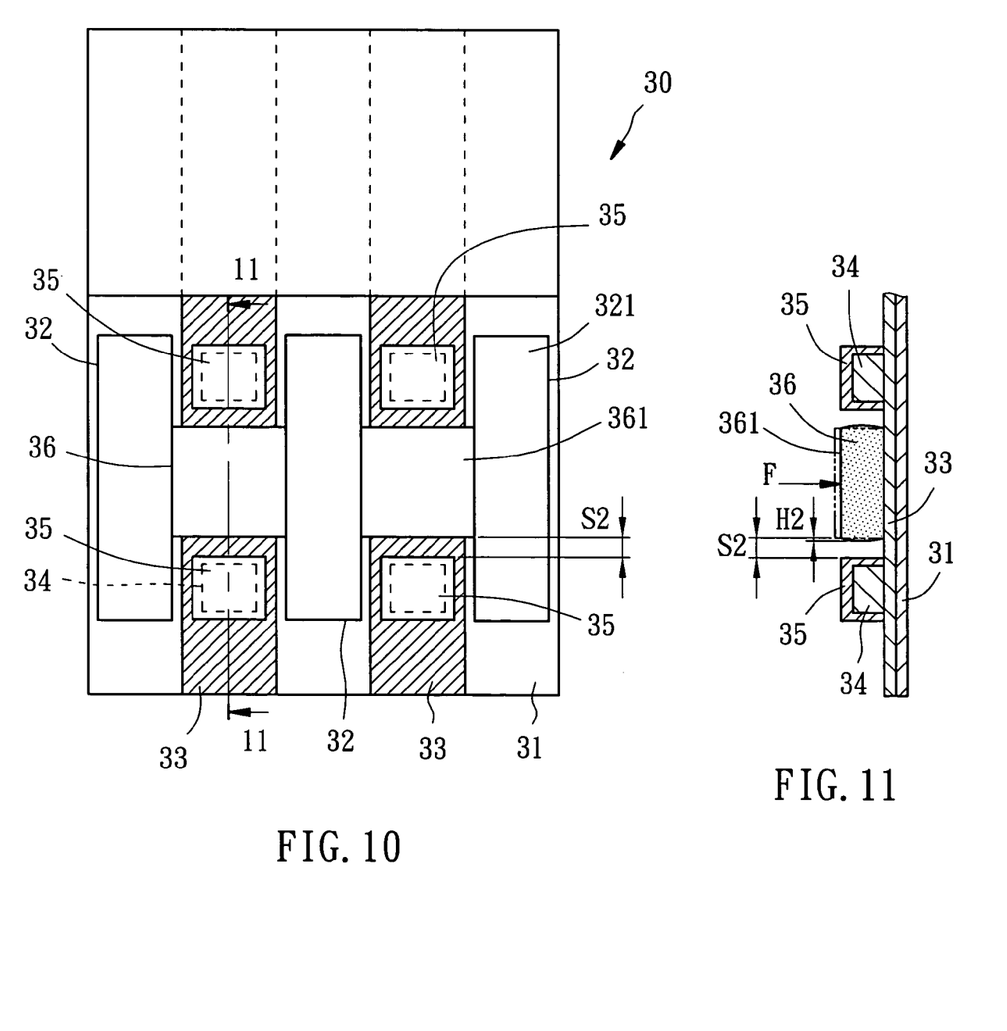
FIG. 10 is a top view of a second preferred embodiment of the present invention.
FIG. 11 is a sectional view along 11-11 line of FIG. 10, which the second elastic member bending.

The equivalent structures of the probe card of the present invention are described hereunder:

FIG. 10 and FIG. 11 show a probe card 30 of the second preferred embodiment of the present invention, and the different parts of the probe card 30 are:

The probe card 30 is provided with a plurality of first elastic members 32 on a plate 31 and a plurality of wire 33, each of which is provided with two probes 35, and each of the probes 35 has a conductive member 34 therein. The probe card 30 further includes a plurality of second elastic members 36, each of which is connected to the wires 33 respectively and keeps a second interval S2 from the neighboring probes 35. Each of the second elastic members 32 has a second top 361, which has a height as same as a first top 321 of the first elastic member 32. The second elastic member 32 also may be made of a material chosen from epoxy resin, PAC resin, acrylic resin, t-BOC resin, PHS resin, COMA resin, cyclic olefin resin, and rubber and the relative materials. The first and second elastic members 32 and 36 may be made into a single unit, as shown in FIG. 10. They also may be independent elements and may be not limited in the aspect shown in FIGS.

When the second elastic member 36 is exerted by a force F and deformed, the second elastic member 36 will has a second deformation H2 toward the neighboring probe 35, which is calculated and tested carefully. The second deformation H2 is smaller than or identical to the second interval S2 to prevent the probes 35 from damage by the deformation of the second elastic members 36.

Figure 12:
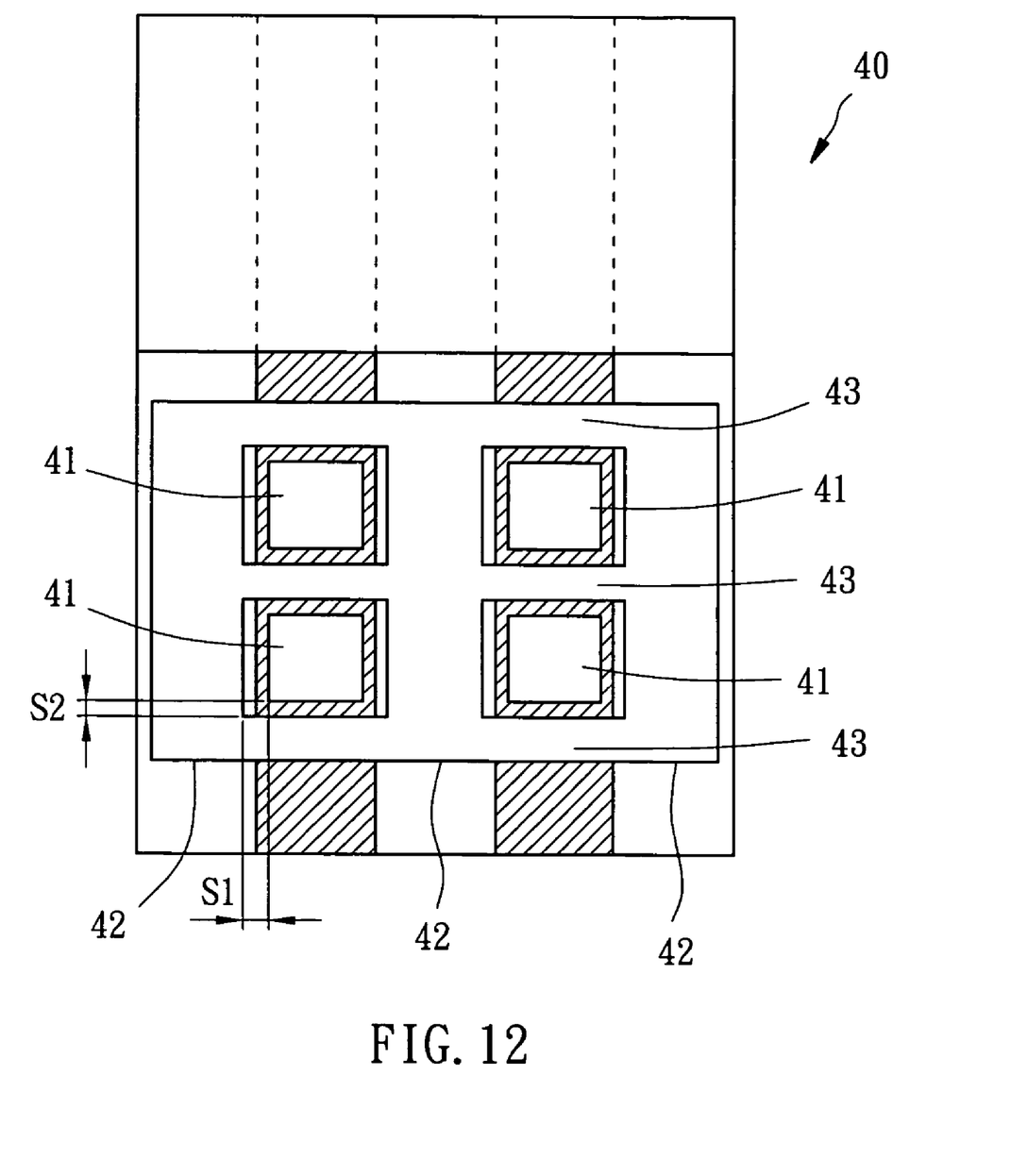
FIG. 12 is a top view of a third preferred embodiment of the present invention.

FIG. 12 shows a probe card 40 of the third preferred embodiment of the present invention, in which probes 41 are surrounded by vertical first elastic members 42 and transverse second elastic members 43 respectively. The first elastic members 42 keep a first interval S1 from the neighboring probes 41 respectively, and the second elastic members 42 keep a second interval S2 from the neighboring probes 41 respectively also.

Figure 13:
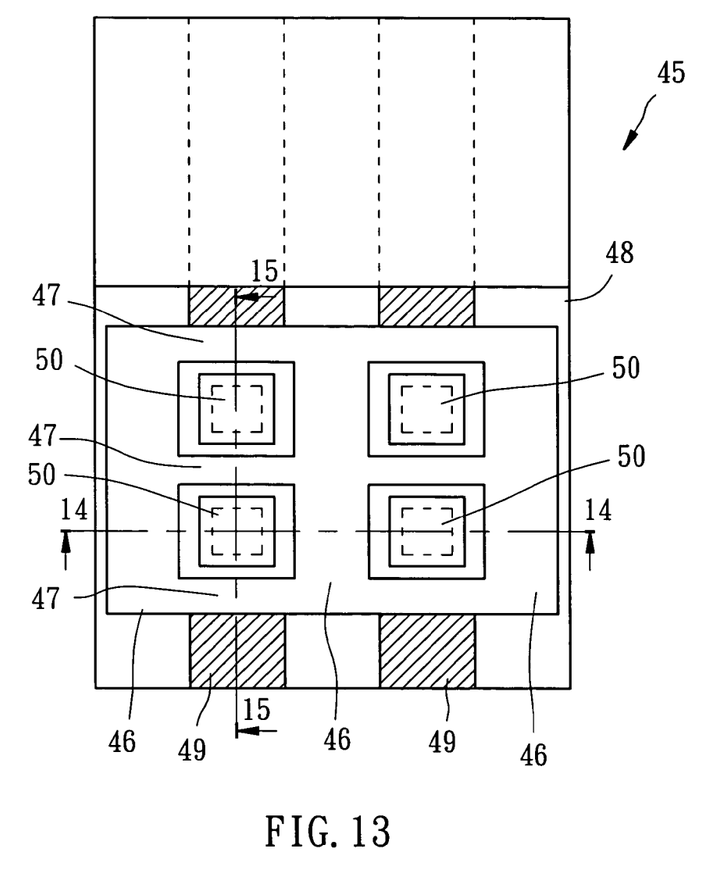
FIG. 13 is a top view of a fourth preferred embodiment of the present invention.
Figure 14:
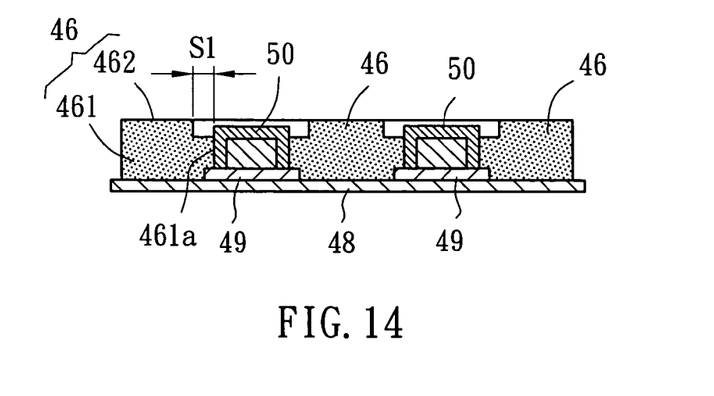
FIG. 14 is a sectional view along 14-14 line of FIG. 13.
Figure 15:
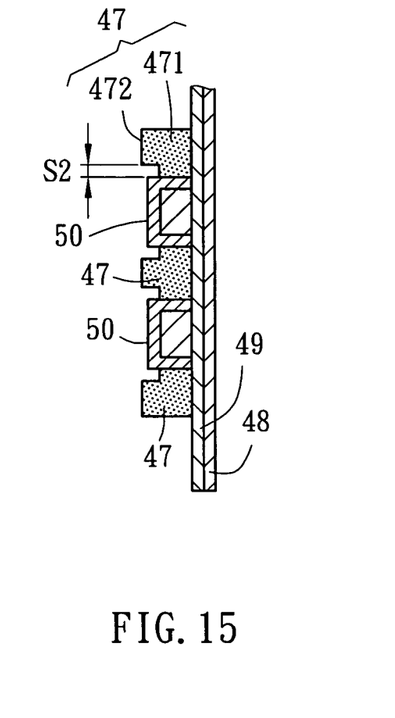
FIG. 15 is a sectional view along 15-15 line of FIG. 13.

FIGS. 13 to 15 shows a probe card 45 of the fourth preferred embodiment of the present invention, which is similar to the probe card 40 of the third preferred embodiment, except that each of first elastic members 46 and second elastic members 47 has a base 461, 471 and a top 462, 472 respectively. Bottoms of the bases 461 of the first elastic members 46 touch a plate 48 and neighboring wires 49, and lateral sides 461a of the bases 46 touch neighboring probes 50. The tops 462 of the bases 461 of the first elastic members 46 keep a first interval S1 from the neighboring probes 50. The tops 462 of the bases 461 may be pressed for deformation. Bottoms of the bases 471 touch the neighboring wires 49, and lateral sides 471a of the bases 471 touch the neighboring probes 50, and the tops 472 of the bases 471 of the second elastic members 47 keep a second interval S2 from the neighboring probes 50. The tops 472 of the bases 471 may be pressed for deformation.

Figure 16:
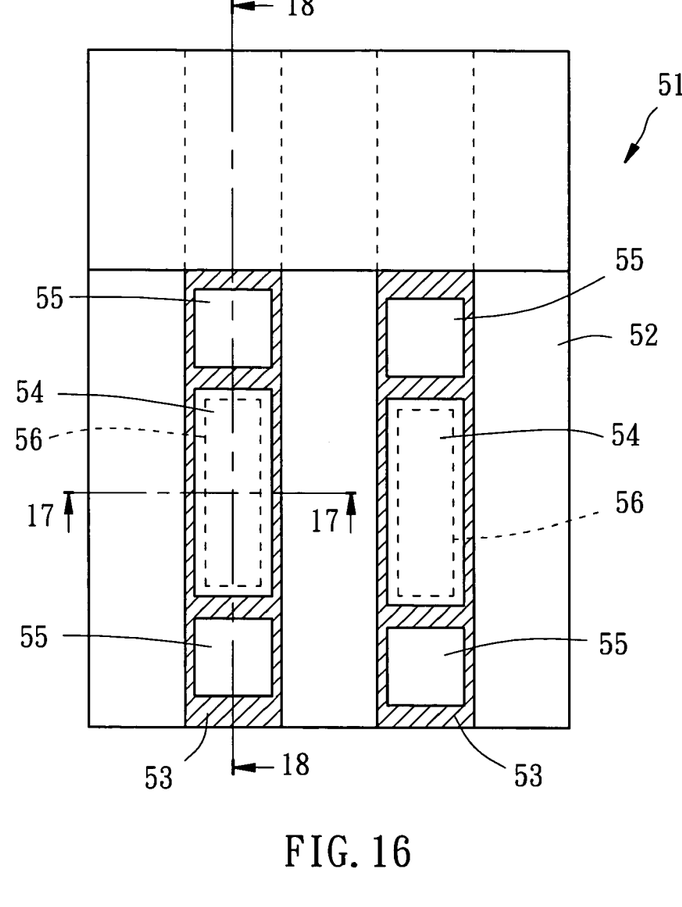
FIG. 16 is a top view of a fifth preferred embodiment of the present invention.
Figure 17:
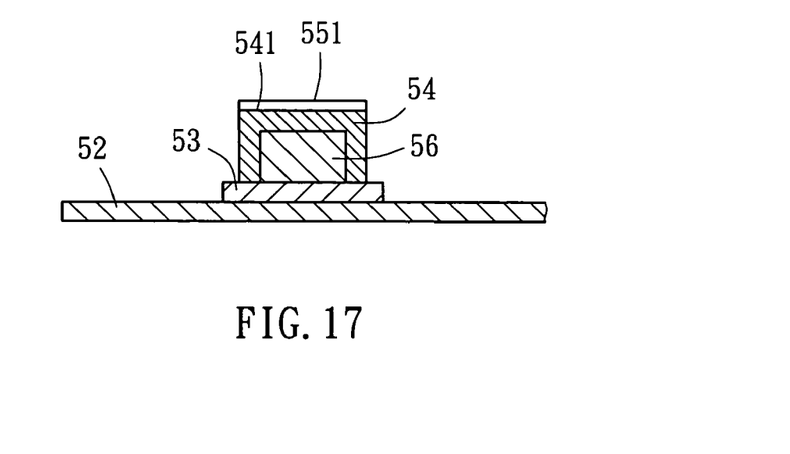
FIG. 17 is a sectional view along 17-17 line of FIG. 16.
Figure 18:
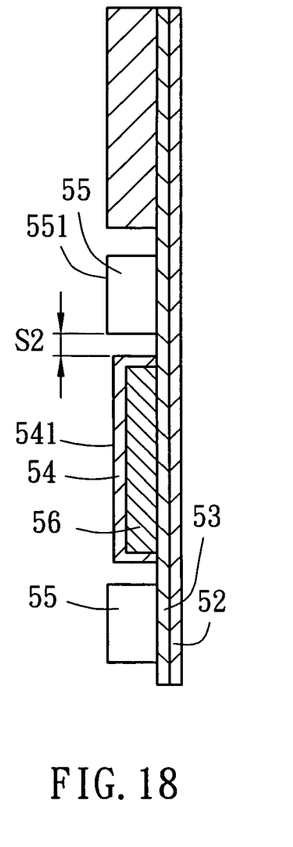
FIG. 18 is a sectional view along 18-18 line of FIG. 16.

FIGS. 16 to 18 shows a probe card 51 of the fourth preferred embodiment of the present invention, in which a plate 52 has a plurality of wires 53 thereon, and each of the wires 53 is provided with a probe 54 and a second elastic member 55. The probe 54 has a conductive member 56 therein. A second top 551 of the second elastic member 55 is higher than a conductive contacting portion 541 of the probe 54, and the second elastic member 55 keeps a second interval S2 from the neighboring probe 54.

The above five preferred embodiments disclose the varied relations of the probes and the first and second elastic members of the probe cards. It is noted that the second to fourth embodiments also disclose the first and second elastic members may be made of a single unit.

Figure 19:
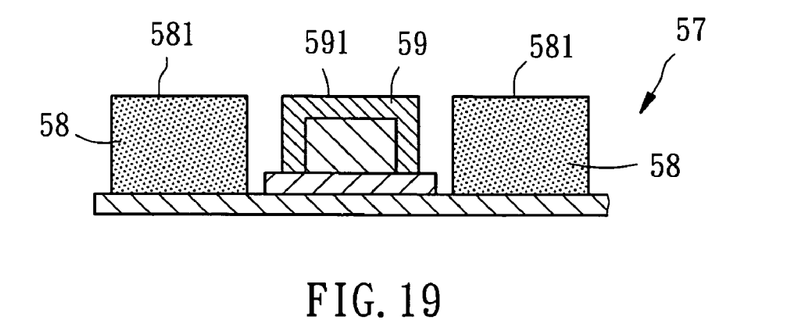
FIG. 19 is a sketch diagram of the present invention, showing the top of the elastic member and the conductive contacting portion of the probe at the same level.
Figure 20:
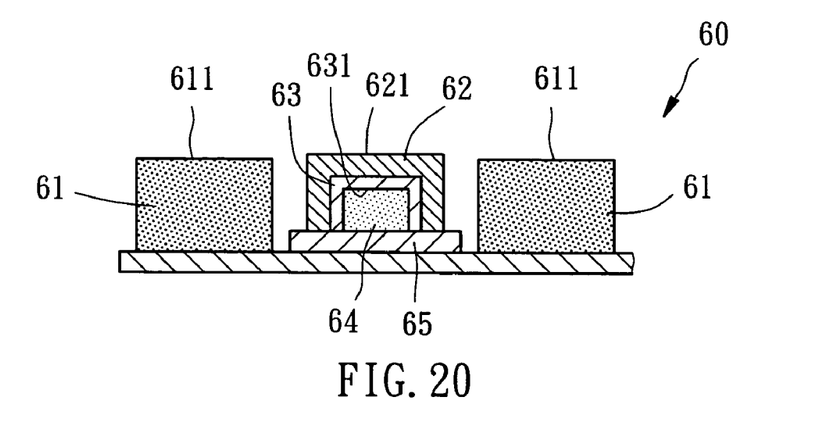
FIG. 20 and FIG. 21 show the top of the elastic member of the present invention lower than the conductive contacting portion of the probe.

In addition, the above embodiments disclose the elastic members (including the first and second elastic members) has the tops (including the first top and second top) higher than the conductive contacting portions of the probes that may absorb the force of the probes pressing the testing device. However, to absorb the force effectively, the probes are made of conductive metal foils, such that the probes may be deformed when they press the testing device. To meet the various testing devices, the tops of the elastic members may be higher or lower than the conductive contacting portions of the probe. FIG. 19 shows a probe card 57 having tops 581 of elastic members 58 and conductive contacting portions 591 of probes 59 at the same height. FIG. 20 shows a probe card 60 having tops 611 of elastic members 61 lower than conductive contacting portions 621 of probes 62. The elastic member 61 will have enough power to absorb the force while the deformation of the pressed probe 62 is greater than the height difference between the top 611 of the elastic member 61 and the conductive contacting portion 621 of the probe 62.

As shown in FIG. 20, a conductive member 63 has a second space 631 therein and a buffer member 64 received in the second space 631. A bottom of the buffer member 64 touches a wire 65 that may reduce the external force exerted on the probes directly, in other words, the buffer member 64 may prevent the probe 62 from damage.

Figure 21:
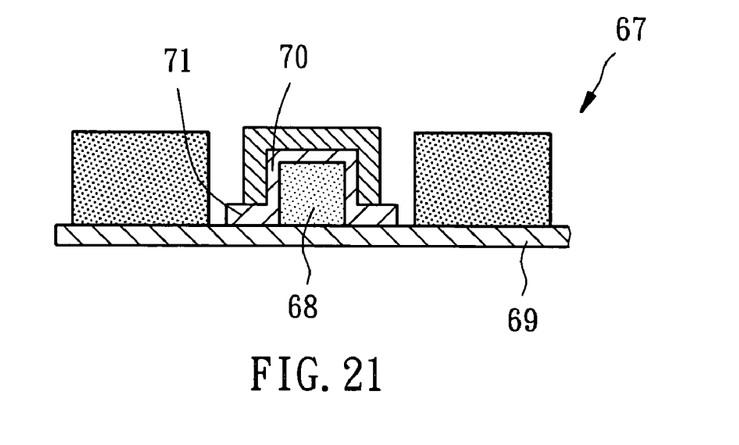

FIG. 21 shows a probe card 67 having a buffer member 68 also, which the difference is that a bottom of the buffer member 68 touches a plate 69. With such structure, conductive members 70 and wires 71 may be made in a single process.

Figure 22:
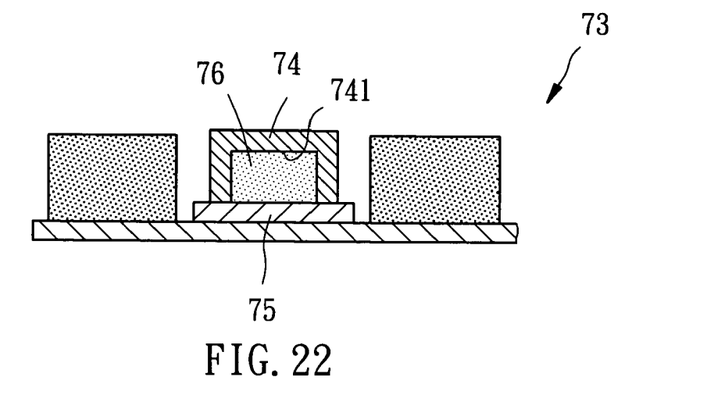
FIG. 22 shows the buffer member between the probe and the wire.

FIG. 22 shows a probe card 73 without the conductive member. A probe 74 has a space 741 therein and a buffer member 76 received in the space 741 to touch a wire 75. It is noted that the embodiment of the probe with the buffer member may be incorporated in above embodiments.

Figure 23:
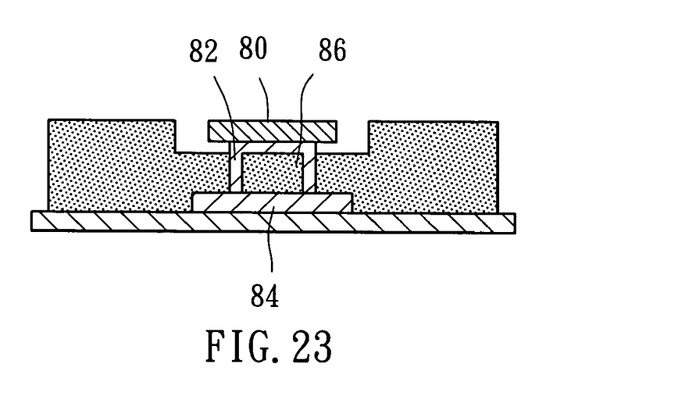
FIG. 23 and FIG. 24 show the probe of the present invention stacked on the conductive member.
Figure 24:
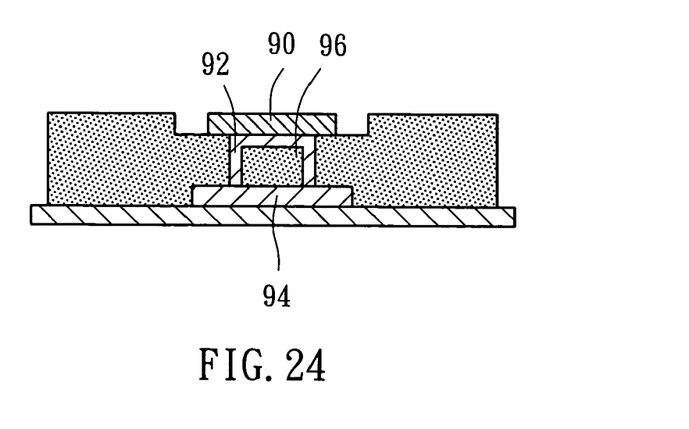

Above embodiments disclose the probe with the conductive member embedded therein. However, the probe may be made as shown in FIG. 23 and FIG. 24. The probe 80 or 90 is stacked on a conductive member 82 or 94 to electrically connect a wire 84 or 94 through the conductive member 82 or 94. Of course, a buffer member 86 or 96 may be provided between the conductive member 82 or 94 and the wire 84 or 94.

The description above is a few preferred embodiments of the present invention and the equivalence of the present invention is still in the scope of the claim of the present invention.

What is claimed is:

1. A probe card for test of a circuit of an electric device, comprising:
   a substrate;
   a plurality of probes provided on the substrate;
   a plurality of elastic members provided on the substrate, wherein the elastic members are deformed when the probes press the circuit of the electric device,
   wherein the substrate includes a plate and a plurality of wires provided on the plate, each of the wires being electrically connected to at least one of the probes, each of the elastic members including a plurality of first elastic members on the substrate, each of the first elastic members keeping a first interval from the neighboring probe, thereby each of the first elastic members has deformation toward the neighboring probe with the length of the first deformation being less than the first interval when the first elastic members receive external force; and
   further comprising a plurality of buffer members, wherein each of the probes has a space therein to receive the buffer members.

2. The probe card as defined in claim 1, wherein a material of the first elastic members is selected from the group consisting of epoxy resin, PAC resin, acrylic resin, t-BOC resin, PHS resin, COMA resin, cyclic olefin resin, and rubber.

3. The probe card as defined in claim 1, wherein the elastic members further includes a plurality of second elastic members provided on the wires, and each of the second elastic members keeps a second interval from the neighboring probe, thereby each of the second elastic members has a second deformation toward the neighboring probe with the length of the second deformation being less than the second interval when the second elastic members receive external force.

4. The probe card as defined in claim 3, wherein a material of the second elastic members is selected from the group consisting of epoxy resin, PAC resin, acrylic resin, t-BOC resin, PHS resin, COMA resin, cyclic olefin resin, and rubber.

5. The probe card as defined in claim 1, further comprising a plurality of conductive members, which are located between the probes and the wires to electrically connect the probes and the wires.

6. The probe card as defined in claim 5, wherein each of the probes has a first space therein to receive the conductive member.

7. The probe card as defined in claim 5, wherein each of the probes has a second space therein to receive the buffer member.

8. The probe card as defined in claim 7, wherein the buffer members are provided on the surface of the plate, and each of the conductive members together with the corresponding wire forms a single unit with the same material.

9. The probe card as defined in claim 1, wherein each of the first elastic members has a base, which has a bottom touching the plate and the neighboring wire and at least a lateral side touching the neighboring probe, and a top keeping the first interval from the neighboring probe.

10. The probe card as defined in claim 3, wherein each of the second elastic members has a base, which has a bottom touching the corresponding wire and at least a lateral side touching the neighboring probe, and a top keeping the second interval from the neighboring probe.

11. A probe card for test of a circuit of an electric device, comprising:
    a substrate;
    a plurality of probes provided on the substrate; and
    a plurality of elastic members provided on the substrate, wherein the elastic members are deformed when the probes press the circuit of the electric device,
    wherein the substrate includes a plate and a plurality of wires provided on the plate, each of the wires is electrically connected to at least one of the probes, and the elastic members include a plurality of second elastic members on the wires, each of the second elastic members keeps a second interval from the neighboring probe, thereby each of the second elastic members has a second deformation toward the neighboring probe with the length of the second deformation being less than the second interval when the second elastic members receive external force; and
    further comprising a plurality of buffer members, wherein each of the probes has a space therein to receive the buffer members.

12. The probe card as defined in claim 11, wherein a material of the second elastic members is selected from the group consisting of epoxy resin, PAC resin, acrylic resin, t-BOC resin, PUS resin, COMA resin, cyclic olefin resin, and rubber.

13. The probe card as defined in claim 11, wherein the elastic members further includes a plurality of first elastic members on the substrate, which keeps a first interval from the neighboring probe, thereby each of the first elastic members has a first deformation toward the neighboring probe with the length of the first deformation being less than the first interval when the first elastic members receive external force.

14. The probe card as defined in claim 13, wherein a material of the first elastic members is selected from the group consisting of epoxy resin, PAC resin, acrylic resin, t-BOC resin, PUS resin, COMA resin, cyclic olefin resin, and rubber.

15. The probe card as defined in claim 11, further comprising a plurality of conductive members, which are located between the probes and the wires to electrically connect the probes and the wires.

16. The probe card as defined in claim 15, wherein each of the probes has a first space therein to receive the conductive member.

17. The probe card as defined in claim 15, wherein each of the probes has a second space therein to receive the buffer member.

18. The probe card as defined in claim 17, wherein the buffer members are provided on the surface of the plate, and each of the conductive members together with the corresponding wire forms a single unit with the same material.

19. The probe card as defined in claim 11, wherein each of the second elastic members has a base, which has a bottom touching the plate and the neighboring wire and at least a lateral side touching the neighboring probe, and a top keeping the second interval from the neighboring probe.

20. The probe card as defined in claim 13, wherein each of the first elastic members has a base, which has a bottom touching the corresponding wire and at least a lateral side touching the neighboring probe, and a top keeping the first interval from the neighboring probe.

* * * * *